US009139003B2

(12) United States Patent
Watanabe et al.

(10) Patent No.: US 9,139,003 B2
(45) Date of Patent: Sep. 22, 2015

(54) METHOD FOR PRODUCING LIQUID-EJECTION HEAD

(71) Applicant: CANON KABUSHIKI KAISHA, Tokyo (JP)

(72) Inventors: Masahisa Watanabe, Yokohama (JP); Toshiyasu Sakai, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 169 days.

(21) Appl. No.: 14/048,412

(22) Filed: Oct. 8, 2013

(65) Prior Publication Data

US 2014/0096385 A1 Apr. 10, 2014

(30) Foreign Application Priority Data

Oct. 10, 2012 (JP) ................................ 2012-225065

(51) Int. Cl.

| | |
|---|---|
| ***B21D 53/76*** | (2006.01) |
| ***H01L 41/22*** | (2013.01) |
| ***B41J 2/135*** | (2006.01) |
| ***B41J 2/16*** | (2006.01) |
| *B41J 2/14* | (2006.01) |

(52) U.S. Cl.

CPC .............. *B41J 2/1606* (2013.01); *B41J 2/1603* (2013.01); *B41J 2/1628* (2013.01); *B41J 2/1629* (2013.01); *B41J 2/1631* (2013.01); *B41J 2/1632* (2013.01); *B41J 2/1639* (2013.01); *B41J 2/1642* (2013.01); *B41J 2/1645* (2013.01); *B41J 2/1646* (2013.01); *B41J 2002/14467* (2013.01); *Y10T 29/49401* (2015.01)

(58) Field of Classification Search

CPC .. Y10T 29/49401; Y10T 29/42; B41J 2/1623; H01L 41/39

See application file for complete search history.

(56) References Cited

U.S. PATENT DOCUMENTS

| | | | | |
|---|---|---|---|---|
| 6,022,482 | A * | 2/2000 | Chen et al. | 216/27 |
| 6,234,608 | B1 * | 5/2001 | Genovese et al. | 347/54 |
| 6,331,258 | B1 * | 12/2001 | Silverbrook | 216/27 |
| 6,569,343 | B1 * | 5/2003 | Suzuki et al. | 216/27 |
| 7,517,051 | B2 * | 4/2009 | Kim et al. | 347/47 |
| 7,600,856 | B2 * | 10/2009 | Lebens et al. | 347/56 |
| 2002/0044176 | A1 * | 4/2002 | Yamaguchi et al. | 347/63 |
| 2005/0140727 | A1 * | 6/2005 | Silverbrook | 347/47 |

FOREIGN PATENT DOCUMENTS

JP 2007-144878 A 6/2007

* cited by examiner

*Primary Examiner* — David Angwin

(74) *Attorney, Agent, or Firm* — Canon USA Inc. IP Division

(57) ABSTRACT

A method for producing a liquid-ejection head includes the steps of: forming molds on or above a substrate, the molds being used as molding members for forming liquid chambers; forming a flow-passage-forming member by depositing an inorganic material on or above the substrate and the molds by chemical vapor deposition, the flow-passage-forming member having depressed portions each formed in an area between an adjacent pair of liquid-chamber side walls in which the molds are not formed; forming a photosensitive resin layer by depositing a photosensitive resin on the flow-passage-forming member and in the depressed portions; forming filling members in the depressed portions by grinding the photosensitive resin layer until the upper surface of an orifice plate is exposed; after grinding the photosensitive resin layer, forming ejection ports in the flow-passage-forming member; and, after forming the ejection ports, removing the molds.

7 Claims, 4 Drawing Sheets

METHOD FOR PRODUCING LIQUID-EJECTION HEAD

BACKGROUND OF THE INVENTION

1. Field of the Invention

The present invention relates to a method for producing a liquid-ejection head and particularly to an inkjet recording head.

2. Description of the Related Art

U.S. Pat. No. 7,600,856 discloses an example of the related art that provides a liquid-ejection head including an orifice plate composed of an inorganic material. In this example, molding members are formed in areas in which liquid chambers, such as liquid-ejection chambers, are to be formed, and subsequently an inorganic material is deposited on the molding members by chemical vapor deposition (CVD) so as to cover the molding members, thereby forming an orifice plate and liquid-ejection chamber walls.

Japanese Patent Laid-Open No. 2007-144878 discloses a technique for reducing difference in level due to stepped portions created on an orifice plate. In this technique, the difference in level due to stepped portions is reduced by forming a difference-in-level-reduction layer by plating between ejection chamber walls.

SUMMARY OF THE INVENTION

The present invention provides a method for producing a liquid-ejection head including: a substrate on or above which a plurality of actuators are formed, the plurality of actuators generating energy for ejecting a liquid; and a flow-passage-forming member on or above the substrate, the flow-passage-forming member defining ejection ports through which the liquid is ejected and a plurality of liquid chambers each having a corresponding one of the plurality of actuators, the flow-passage-forming member including an orifice plate defining the ejection ports and liquid-chamber side walls defining side walls of the plurality of liquid chambers, the method including the steps of:

(1) forming molds on or above the substrate, the molds being used as molding members for forming the plurality of liquid chambers;

(2) forming the flow-passage-forming member by depositing an inorganic material on or above the substrate and the molds by chemical vapor deposition, the flow-passage-forming member having depressed portions each formed in an area between an adjacent pair of the liquid-chamber side walls in which the molds are not formed;

(3) forming a photosensitive resin layer by depositing a photosensitive resin on the flow-passage-forming member and in the depressed portions;

(4) forming filling members in the depressed portions by grinding the photosensitive resin layer until an upper surface of the orifice plate is exposed;

(5) after grinding the photosensitive resin layer, forming the ejection ports in the flow-passage-forming member; and (6) after forming the ejection ports, removing the molds.

Further features of the present invention will become apparent from the following description of exemplary embodiments with reference to the attached drawings.

DESCRIPTION OF THE EMBODIMENTS

When an orifice plate and liquid-ejection chamber walls are formed by depositing an inorganic material on molding members by CVD so as to cover the molding members, a film is formed relatively tightly along the molding members due to the nature of CVD, and consequently three-dimensional protrusions and depressions formed using the molding members are directly transferred to the film. As a result, depressed portions depressed toward the orifice plate are disadvantageously formed at the orifice plate. In particular, depressed portions formed between the walls partitioning adjacent liquid-ejection chambers from each other are formed in areas adjoining the ejection ports.

Fine liquid particles generated due to liquid ejection may accumulate in the depressed portions, thereby forming liquid pools in the depressed portions. The liquid pool gradually grows larger and may reach the vicinity of the ejection port through which a liquid is ejected. As a result, when being ejected, flying liquid particles may come into contact with the liquid pool, which may alter the ejection direction, and consequently printing quality may be degraded. When the liquid pool is removed by cleaning the surface of the orifice plate by wiping or the like in order to prevent the ejection direction from being altered, it is difficult to remove the liquid pool because the wiping blade does not efficiently come into contact with the depressed portion.

An example of a method for filling the depressed portions is a method in which the depressed portions are filled by depositing an inorganic material by plating to reduce difference in level due to the stepped portions. However, this method requires a long processing time and huge equipment investment, and thus the production cost increases.

Accordingly, the present invention provides a method for producing a liquid-ejection head with which depressed portions formed in a flow-passage-forming member may be efficiently filled even when the flow-passage-forming member is formed by depositing an inorganic material by CVD.

The present invention may also provide a method for easily producing a liquid-ejection head including a flow-passage-forming member formed by depositing an inorganic material by CVD with which depressed portions may be efficiency filled, formation of liquid pools may be suppressed, and degradation of printing quality may be suppressed.

Hereafter, the embodiment of the present invention is described in detail with reference to the attached drawings. The embodiment described below does not limit the scope of the present invention and is intended to provide those who are skilled in the art with sufficient explanation of the present invention.

Figure 1A:
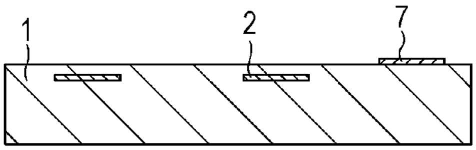
FIGS. 1A to 1H are schematic cross-sectional views for explaining the steps of a method for producing a liquid-ejection head according to an embodiment of the present invention.
Figure 1B:
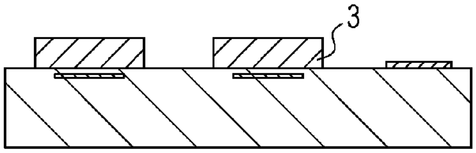
Figure 1C:
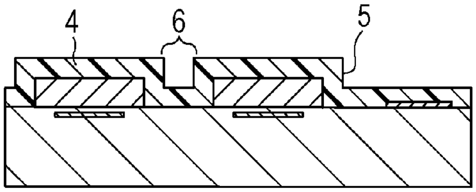
Figure 1D:
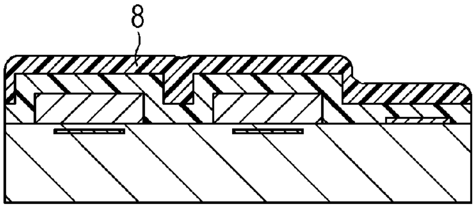
Figure 1E:
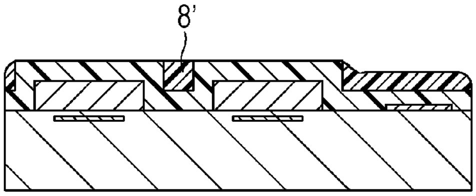
Figure 1F:
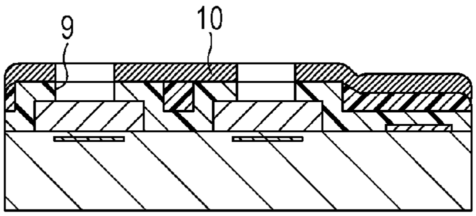
Figure 1G:
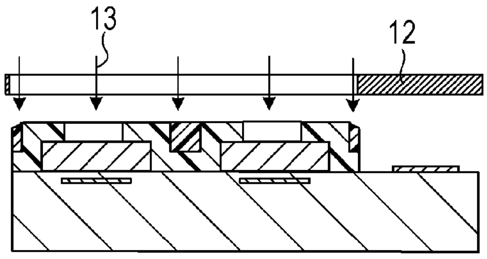
Figure 1H:
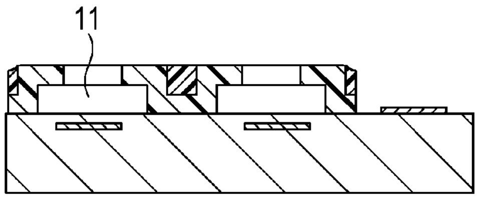
Figure 2:
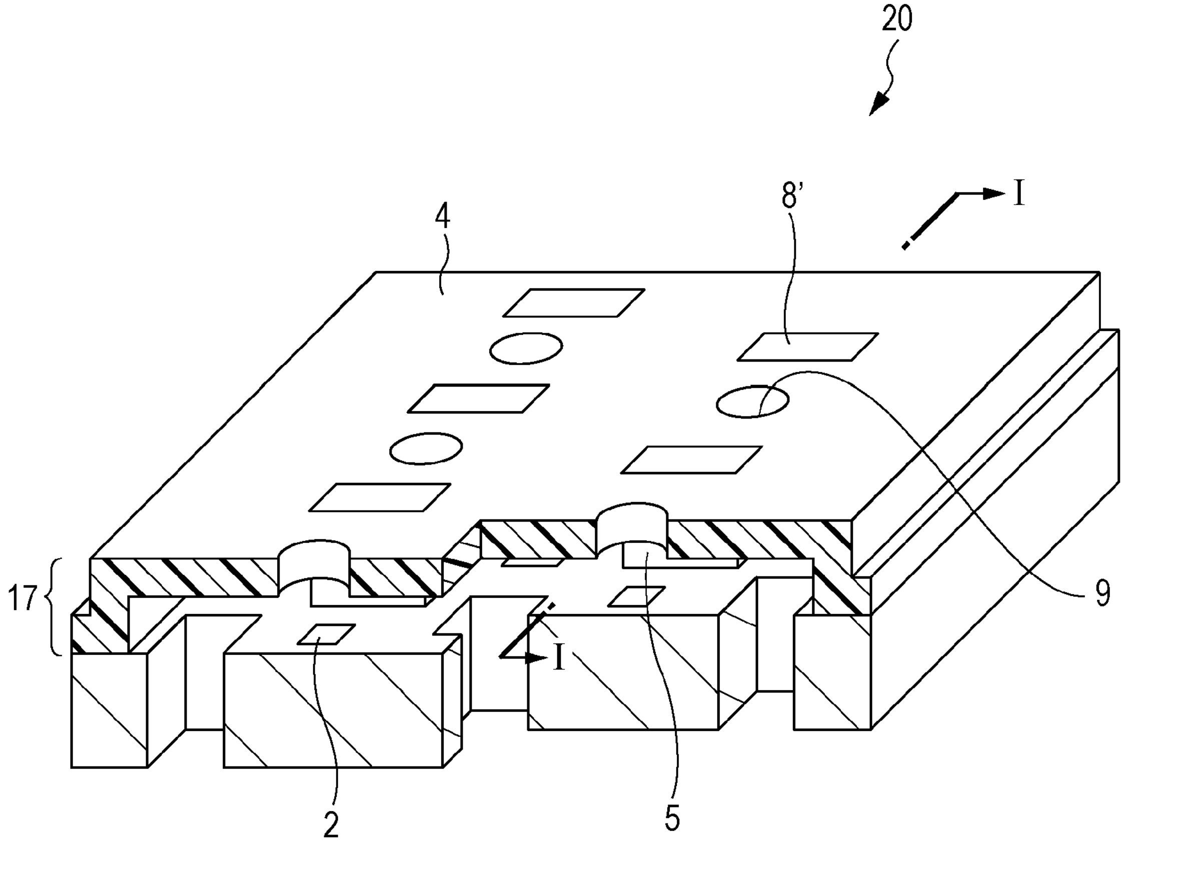
FIG. 2 is a schematic perspective view illustrating an example of a liquid-ejection head produced according to an embodiment of the present invention.

FIG. 2 is a perspective view illustrating a liquid-ejection head 20 produced according to this embodiment. FIGS. 1A to 1H are schematic cross-sectional views for explaining the steps of the method for producing a liquid-ejection head, which are taken along line I-I in FIG. 2 and viewed in a direction perpendicular to the cross-section. Now, steps of the producing method according to this embodiment are described in order with reference to FIGS. 1A to 1H.

As shown in FIG. 1A, a liquid-ejection-head substrate 1 (hereafter, also referred to as simply "substrate") is prepared. The substrate 1 has a plurality of actuators 2 (also referred to as "ejection-energy-generating elements") that generate energy for ejecting a liquid, such as ink.

The actuators 2 are supplied with electricity through an electrode pad 7 (hereafter, also referred to as "pad") formed on the substrate.

The substrate 1 may be a single-crystal silicon substrate, on or above which a driving circuit and wiring lines that connect the drive circuit to the actuators can be easily arranged.

An example of the actuator 2 is heater-type actuators that generate heat by passing electricity through a resistor. Another example of the actuator 2 is elements that convert electric energy into ejection energy.

As shown in FIG. 1B, molds 3 are formed on or above the substrate. The molds 3 serve as molding members used for forming liquid chambers and are removable in the post-process.

The molds 3 serve as molding members for forming internal spaces of the flow-passage-forming member. The internal spaces of the flow-passage-forming member are, for example, liquid-flow passages that connect liquid-supply ports to the liquid chambers.

The material of the mold is selected while considering the material of the peripheral members. In this embodiment, an organic resin material or a metal material may be selected since the flow-passage-forming member defining the orifice plate and the liquid-chamber side walls is composed of an inorganic material. An example of the organic resin material is a polyimide resin with consideration of heat resistance. Examples of the metal material include aluminium and an aluminium alloy with consideration of removability.

When the mold material is a metal material, the mold material can be deposited by physical vapor deposition (PVD), such as sputtering. The metal material can be patterned by reactive ion etching (RIE) using a gas corresponding to the selected metal material with a photoresist mask formed on the metal material. When the metal material is aluminium, a chlorine etching gas may be used.

When the mold material is an organic resin material, the mold material can be deposited by a common coating method, such as spin-coating. When the mold material is a photosensitive material, the mold material can be patterned through the exposure and development process. When the mold material is a non-photosensitive material, the mold material can be patterned by reactive ion etching (RIE) using an oxygen-based gas with a mask formed of photoresist or the like on the mold material.

As shown in FIG. 1C, an inorganic material is deposited on or above the substrate 1 and the molds 3 by chemical vapor deposition (CVD) to form a flow-passage-forming member 17. The flow-passage-forming member 17 includes an orifice plate 4 defining upper walls of the liquid chambers in which ejection ports are to be formed and liquid-chamber side walls 5 defining side surfaces of the liquid chambers. In this embodiment, the orifice plate 4 and the liquid-chamber side walls 5 are composed of an inorganic material, and the flow-passage-forming member 17 has depressed portions 6 formed in areas on which the molds 3 are not formed. In other words, the flow-passage-forming member 17 has depressed portions formed between two opposing liquid-chamber side walls located between two adjacent liquid chambers.

An example of the inorganic material is, but not limited to, a silicon compound composed of silicon and at least one substance selected from oxygen, nitrogen, and carbon. Specific examples of the silicon compound include a silicon oxide, a silicon nitride, a silicon carbide, and a silicon oxynitride. The inorganic material may be deposited by, for example, plasma enhanced CVD (PECVD).

Since CVD is a conformal deposition method, a stepped portion is created between an area on which the mold is formed and an area on which the mold is not formed. Thus, the depressed portions 6 are formed.

As shown in FIG. 1D, a photosensitive resin that is a filling material is applied to the flow-passage-forming member to form a photosensitive resin layer 8, and thereby the depressed portions 6 are filled with the photosensitive resin. In other words, a photosensitive resin that is a filling material is applied to the entire surface of the substrate including the depressed portions 6 to form a photosensitive resin layer 8, and thereby the depressed portions are filled with the photosensitive resin.

Examples of the photosensitive resin include a photosensitive epoxy resin and a photosensitive polyimide resin. The photosensitive resin is cured to form filling members, which remain in the depressed portions formed in the surface of the orifice plate. Therefore, the photosensitive resin may be a negative resist that cures by being exposed to light.

A method for applying the photosensitive resin is, for example, spin-coating and may be selected, as appropriate, from methods for applying a liquid substance.

The photosensitive resin layer 8 is composed of the photosensitive resin deposited on the flow-passage-forming member. After being deposited on the flow-passage-forming member and the substrate, the photosensitive resin may be solidified by, for example, baking. When the photosensitive resin is a negative resist, it can be cured by being exposed to light.

As shown in FIG. 1E, the photosensitive resin layer 8 is ground until the upper surface of the orifice plate (hereafter, also referred to as "orifice plane") is exposed. As a result, filling members 8' are formed in the depressed portions. The photosensitive resin layer 8 is ground so that the upper surfaces of the filling members 8' are aligned with the upper surface of the orifice plate.

The photosensitive resin layer 8 is ground by, for example, chemical mechanical polishing (CMP). The upper surfaces of the filling members 8' are aligned with the orifice plane by CMP.

In this embodiment, the photosensitive resin layer 8 is not required to be ground until the upper surfaces of the filling members 8' are completely aligned with the upper surface of the orifice plate. The filling members 8' may be ground more than the orifice plate due to the difference in strength between the filling members 8' and the orifice plate, and thus the surfaces of the filling members 8' may become slightly depressed.

As shown in FIG. 1F, ejection ports 9 through which a liquid is ejected are formed.

The ejection ports may be formed by, for example, RIE using a fluorine-based gas with a mask 10 formed of photoresist. Generally, the photoresist is applied to a wafer by spin-coating as a liquid and then baked to form the mask 10. When a liquid photoresist is applied to a substrate having depressed portions at the surface to be applied, the thickness of the photoresist mask may be large in order to sufficiently cover the stepped portions created due to the depressed portions. However, the increased thickness of the photoresist mask may cause the cross-sectional profile of the photoresist mask patterned by being exposed to light to be degraded, which results in a reduction in etching accuracy. When the depressed portions are filled with the filling members as in this embodiment, the stepped portions are not created even when the thickness of the photoresist mask is relatively small. As a result, the accuracy of patterning by being exposed to light is enhanced, and thus the accuracy of finishing the ejection ports is enhanced.

Figure 4:
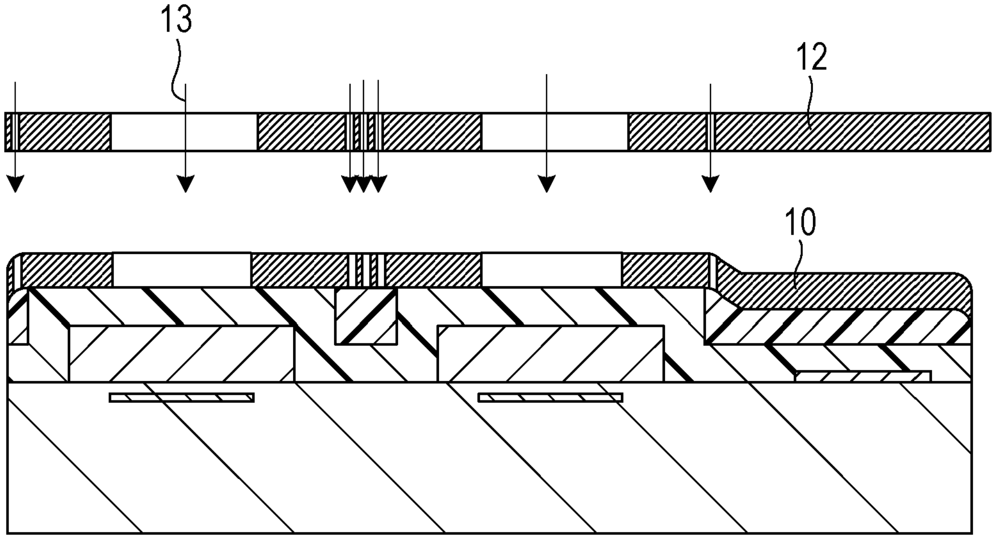
FIG. 4 is a schematic cross-sectional view illustrating an example of a method for producing a liquid-ejection head according to an embodiment of the present invention.

When a pattern for forming the ejection ports is created in the mask 10, as shown in FIG. 4, the pattern may be created also at the positions corresponding to the filling members 8'. In this case, pinholes can be formed in the filling members 8' while the ejection ports are formed. The pinholes formed in the filling members 8' reduce the stress caused in the filling members 8' and increase the adhesion between the filling members 8' and the flow-passage-forming member 17. The pinholes may be formed in a portion of the photosensitive resin layer deposited in the vicinity of the edge portion of the flow-passage-forming member or in the vicinity of the boundary between the photosensitive resin layer and the flow-passage-forming member in which a stepped portion is created. The pinholes may be formed so as to penetrate through the filling members 8' or the photosensitive resin layer, that is, so as to reach the bottom of the filling members 8' or the photosensitive resin layer. Examples of the shape of the horizontal cross-section of the pinholes include a circular shape, an elliptical shape, a rectangular shape, and a polygonal shape. The pattern shape of the pinholes can be dot-like or slit-like. In particular, slit-like pattern may be created. In order to prevent formation of liquid pools in the pinholes formed in the filling members, the pinholes may be small. Specifically, the area of the cross section of the pinhole parallel to the substrate is at least smaller than and preferably 1/10 or less of that of the ejection port.

As shown in FIG. 1G, the photosensitive resin and the inorganic material deposited on or above the pad 7, which is to be connected to an electrode, are removed.

Examples of a method for removing the photosensitive resin and the inorganic material include, but not limited to, the above-described methods, such as photolithography. For example, the inorganic material can be removed by RIE using the photosensitive resin or the like as a mask.

In this embodiment, as shown in FIG. 1G, a portion of the photosensitive resin deposited on or above the pad 7 is removed by photolithography. Specifically, when the photosensitive resin is a negative resist, portions of the photosensitive resin exposed to light are cured, and thus the unexposed portions can be removed using a solvent. Therefore, in this embodiment, as shown in FIG. 1G, the portion of the photosensitive resin deposited on or above the pad is covered with the mask so as not to be exposed to light and subsequently removed using a solvent or the like.

As shown in FIG. 1H, liquid chambers 11 are formed by removing the molds 3. Thus, a liquid-ejection head 20 is produced.

When the mold material is a metal material, the molds 3 can be removed by wet etching using a chemical solution that dissolves the selected metal material. When the metal material is aluminium, a phosphoric-acid-based etchant may be used. The molds may be removed by isotropic etching. When the mold material is an organic resin material, the molds can be removed by CDE using an oxygen-based gas with a protective film. The protective film may be the mask used for forming the ejection ports or may be newly formed in order to protect the filling members.

Through the steps described above, the degradation of printing quality due to liquid pools may be suppressed even when a liquid-ejection head includes an orifice plate composed of an inorganic material.

EXAMPLES

Example 1

An example of the method of producing the liquid-ejection head according to the present invention will be described further in detail with reference to FIGS. 1A to 1H illustrating the steps of the method.

As shown in FIG. 1A, a liquid-ejection-head substrate 1 was prepared by forming actuators 2, wiring lines (not shown) to drive the actuators 2, and a pad 7 through which the actuators 2 were supplied with electricity on one surface of a single-crystal silicon substrate produced by drawing an ingot in the <100> direction.

As shown in FIG. 1B, molds 3 serving as molding members were formed so that a liquid chamber was formed at the position corresponding to each actuator using a material capable of being removed in the post-process. The mold material was aluminium. The molds 3 were formed by depositing aluminium on the substrate by physical vapor deposition (PVD) and patterning the deposited aluminium film. Specifically, the deposited aluminium film was patterned into a desired shape by RIE using a photoresist mask formed on the aluminium film. Then, the photoresist mask on the molds was removed.

As shown in FIG. 1C, a flow-passage-forming member 17 was formed on the substrate 1 and the molds 3 by depositing an inorganic material by PECVD. The inorganic material was SiN. As a result, members that were to be formed into an orifice plate 4 and a liquid-chamber side wall 5 were formed of SiN, and depressed portions 6 were formed in areas in which the molds were not formed.

As shown in FIG. 1D, a photosensitive resin that was a filling material was applied to the entire surface of the substrate including the depressed portions by spin-coating to form a photosensitive resin layer 8. The photosensitive resin was a negative photosensitive polyimide resin. After being deposited on the substrate, the photosensitive resin was baked.

As shown in FIG. 1E, the photosensitive resin layer 8 was ground until the upper surface of the orifice plate was exposed. Thus, the photosensitive resin layer 8 was ground so that the upper surfaces of the filling members 8' were aligned with the upper surface of the orifice plate. The photosensitive layer was ground by CMP. The endpoint of the grinding process was detected on the basis of the selectivity against the orifice plate.

As shown in FIG. 1F, ejection ports 9 through which a liquid is ejected were formed. The ejection ports 9 were formed in the following manner. Photoresist was applied to the flow-passage-forming member 17 and the filling members 8', and portions of the photoresist mask in which the ejection ports were to be formed were patterned to form a mask 10. Then, portions of the orifice plate composed of SiN were removed by RIE using a fluorine-based gas. After forming the ejection ports 9, the mask 10 was removed from the flow-passage-forming member.

As shown in FIG. 1G, the photosensitive resin deposited on the pad 7 was removed through the exposure and development process. In the exposure process, the photosensitive resin was irradiated with UV light 13 using a projection exposure system with a photomask 12. Since the filling members were composed of a photosensitive resin that was a negative resist, the photomask 12 was formed so that a portion of the photosensitive resin deposited on the pad, which was to be removed, was prevented from being exposed to light. Due to the exposure to light, the filling members 8' were cured. In the subsequent development process, the portion of the photosensitive resin deposited on the pad was removed. Then, the substrate was placed in an oven to perform a heat treatment, and thereby dehydration condensation of the resist was performed.

Subsequently, a protective layer that protects the orifice plate was formed, and liquid supply ports through which a liquid is supplied to the liquid chambers was formed from a side of the substrate on which the orifice plate was not formed (not shown).

As shown in FIG. 1H, the molds composed of aluminium were removed using a phosphoric-acid-based etchant to form the liquid chambers 11.

In the liquid-ejection head 20 prepared as described above, although the depressed portions were formed in the orifice plate composed of the inorganic material, the depressed portions were able to be filled with the filling members at low cost.

The liquid-ejection head was evaluated in terms of printing quality. It was found that degradation of printing quality was suppressed because liquid pools due to mist generated when a liquid is ejected were not formed in the depressed portions since the depressed portions were filled with the filling members. It was also found that, when the orifice plate was wiped by a blade, efficient wiping was performed since the depressed portions were filled with the filling members, and thus printing quality was properly recovered.

Example 2

Another example of the method of producing the liquid-ejection head according to the present invention will be described with reference to FIGS. 3A to 3H. The steps shown in FIGS. 3A to 3D in Example 2 are the same as the steps shown in FIGS. 1A to 1D in Example 1.

Figure 3A:
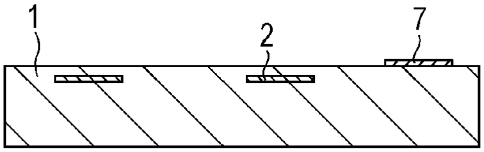
FIGS. 3A to 3H are schematic cross-sectional views for explaining the steps of a method for producing a liquid-ejection head according to an embodiment of the present invention.
Figure 3B:
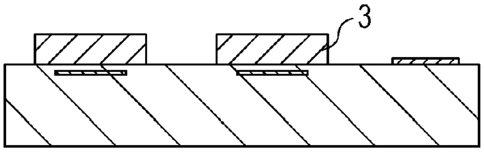
Figure 3C:
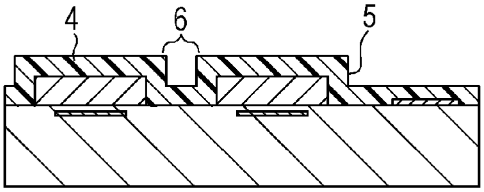
Figure 3D:
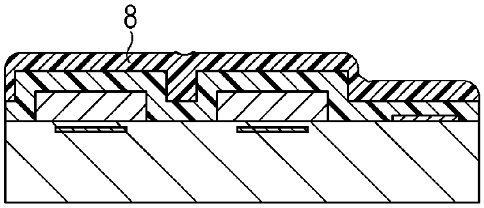
Figure 3E:
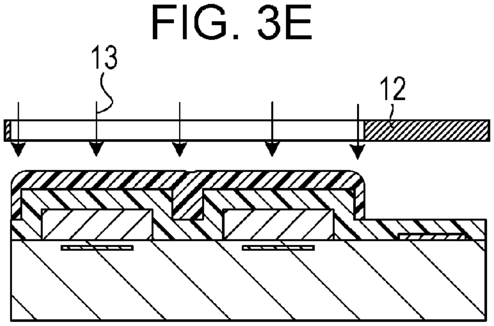

After the step shown in FIG. 3D, in which the photosensitive resin layer 8 was formed on the flow-passage-forming member 17 and the substrate 1, as shown in FIG. 3E, a portion of the photosensitive resin deposited on the pad 7 was removed through the exposure and development process. Specifically, the photosensitive resin layer 8 was irradiated with UV light 13 using a projection exposure system with a photomask 12. Since the photosensitive resin was a negative resist, the photomask 12 was formed so that a portion of the photosensitive resin layer deposited on the flow-passage-forming member 17 was exposed to light and so that a portion of the photosensitive resin deposited on the pad, which was to be removed, was prevented from being exposed to light. In the subsequent development process, the portion of the photosensitive resin deposited on the pad was removed. Then, the substrate was placed in an oven to perform a heat treatment, and thereby dehydration condensation of the resist was performed.

Figure 3F:
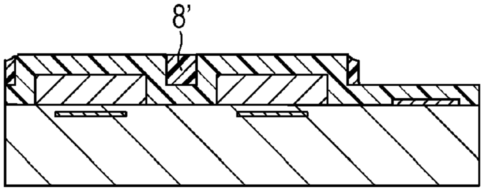

As shown in FIG. 3F, the photosensitive resin layer 8 was ground so that the upper surfaces of the filling members 8' were aligned with the upper surface of the orifice plate. The photosensitive layer 8 was ground by CMP. The endpoint of the grinding process was detected on the basis of the selectivity against the orifice plate.

Figure 3G:
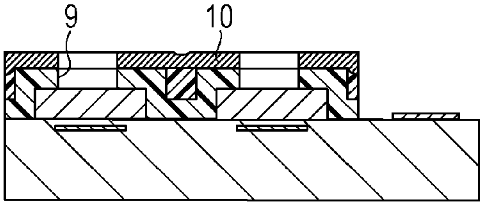

As shown in FIG. 3G, ejection ports 9 through which a liquid is ejected were formed in the following manner. Photoresist was applied to the flow-passage-forming member 17 and the filling members 8', and portions of the photoresist mask in which the ejection ports were to be formed were patterned to form a mask 10. Subsequently, portions of the orifice plate composed of SiN were removed by RIE using a fluorine-based gas. After forming the ejections ports 9, the inorganic material (flow-passage-forming member) deposited on the pad 7 was removed by RIE using a fluorine-based gas with the photoresist mask. Then, the mask 10 was removed from the flow-passage-forming member.

Subsequently, a protective layer that protects the orifice plate was formed, and liquid supply ports through which a liquid is supplied to the liquid chambers was formed from a side of the substrate on which the orifice plate was not formed (not shown).

Figure 3H:
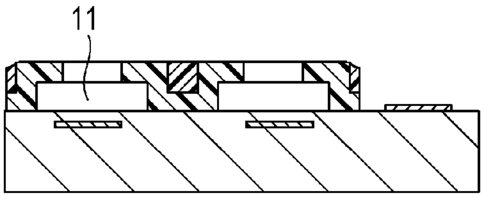

As shown in FIG. 3H, the molds composed of aluminium were removed using a phosphoric-acid-based etchant to form the liquid chambers 11.

In the liquid-ejection head 20 prepared as described above, although the depressed portions were formed in the orifice plate composed of the inorganic material, the depressed portions were able to be filled with the filling members at low cost.

The liquid-ejection head was evaluated in terms of printing quality. It was found that degradation of printing quality was suppressed because liquid pools due to mist generated when a liquid is ejected were not formed in the depressed portions since the depressed portions were filled with the filling members. It was also found that, when the orifice plate was wiped by a blade, efficient wiping was performed since the depressed portions were filled with the filling members, and thus printing quality was properly recovered.

According to the present invention, a method for producing a liquid-ejection head with which the depressed portions formed in the flow-passage-forming member may be efficiently filled even when the flow-passage-forming member was formed by CVD using an inorganic material is provided.

According to the present invention, a method for easily producing a liquid-ejection head including a flow-passage-forming member formed of an inorganic material by CVD with which depressed portions may be efficiency filled, formation of liquid pools may be suppressed, and degradation of printing quality may be suppressed is provided.

Specifically, according to the present invention, a liquid-ejection head that allows depressed portions formed due to the nature of CVD to be efficiently filled with filling members, that allows formation of a liquid pool in the depressed portion to be suppressed, and that allows degradation of printing quality to be suppressed may be produced at low cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-225065 filed Oct. 10, 2012, which is hereby incorporated by reference herein in its entirety.

What is claimed is:

1. A method for producing a liquid-ejection head including:

a substrate on or above which a plurality of actuators are formed, the plurality of actuators generating energy for ejecting a liquid; and a flow-passage-forming member on or above the substrate, the flow-passage-forming member defining ejection ports through which the liquid is ejected and a plurality of liquid chambers each having a corresponding one of the plurality of actuators, the flow-passage-forming member including an orifice plate defining the ejection ports and liquid-chamber side walls defining side walls of the plurality of liquid chambers, the method comprising the steps of:

(1) forming molds on or above the substrate, the molds being used as molding members for forming the plurality of liquid chambers;

(2) forming the flow-passage-forming member by depositing an inorganic material on or above the substrate and the molds by chemical vapor deposition, the flow-passage-forming member having depressed portions each formed in an area between an adjacent pair of the liquid-chamber side walls in which the molds are not formed;

(3) forming a photosensitive resin layer by depositing a photosensitive resin on the flow-passage-forming member and in the depressed portions;

(4) forming filling members in the depressed portions by grinding the photosensitive resin layer until an upper surface of the orifice plate is exposed;

(5) after grinding the photosensitive resin layer, forming the ejection ports in the flow-passage-forming member; and (6) after forming the ejection ports, removing the molds.

2. The method for producing a liquid-ejection head according to claim 1, wherein, in the step (4), the photosensitive resin layer is ground so that upper surfaces of the filling members are aligned with the upper surface of the orifice plate.

3. The method for producing a liquid-ejection head according to claim 1, wherein, in the step (4), the photosensitive resin layer is ground by chemical mechanical polishing (CMP).

4. The method for producing a liquid-ejection head according to claim 1, wherein the photosensitive resin is a negative photosensitive resin.

5. The method for producing a liquid-ejection head according to claim 4, wherein, before the photosensitive resin layer is ground, a portion of the photosensitive resin deposited on the flow-passage-forming member is cured by being exposed to light.

6. The method for producing a liquid-ejection head according to claim 4, wherein, after the photosensitive resin layer is ground, the filling members are cured by being exposed to light.

7. The method for producing a liquid-ejection head according to claim 1, wherein, in the step (5), before the ejection ports are formed, pinholes are formed in the filling members.

* * * * *